United States Patent [19]

Lee et al.

[11] Patent Number: 4,922,311
[45] Date of Patent: May 1, 1990

[54] FOLDED EXTENDED WINDOW FIELD EFFECT TRANSISTOR

[75] Inventors: Kuo-Hua Lee; Chih-Yuan Lu, both of Lower Macungie Township, Lehigh County; David S. Yaney, Bethlehem, all of Pa.

[73] Assignee: American Telephone and Telegraph Company, New York, N.Y.

[21] Appl. No.: 336,197

[22] Filed: Apr. 11, 1989

Related U.S. Application Data

[62] Division of Ser. No. 128,834, Dec. 4, 1987, Pat. No. 4,844,776.

[51] Int. Cl.[5] ................... H01L 29/78; H01L 29/34
[52] U.S. Cl. ............................. 357/23.1; 357/23.9; 357/23.3; 357/52
[58] Field of Search .................. 357/23.1, 23.9, 23.3, 357/52

[56] References Cited

U.S. PATENT DOCUMENTS

| | | | |
|---|---|---|---|
| 4,148,047 | 4/1979 | Hendrickson | 357/23 |
| 4,252,840 | 2/1981 | Minami | 427/91 |
| 4,324,038 | 4/1982 | Chang | 29/571 |
| 4,453,306 | 6/1984 | Lynch | 29/571 |
| 4,586,238 | 5/1986 | Yatsuda et al. | 29/571 |
| 4,593,454 | 6/1986 | Baudrant et al. | 29/571 |
| 4,621,276 | 11/1986 | Malhi | 357/42 |
| 4,665,414 | 5/1987 | Koeneke et al. | 357/15 |
| 4,683,347 | 1/1987 | Iyer | 357/54 |
| 4,753,709 | 6/1988 | Welch et al. | 156/643 |
| 4,804,636 | 2/1989 | Groover, III et al. | 437/52 |
| 4,821,085 | 4/1989 | Haken et al. | 357/67 |

OTHER PUBLICATIONS

Miller et al., "An Advanced High Voltage Bipolar Power Transistor..." IEDM 85, pp. 142-149.
Kaneko et al., "Novel Submicron Devices..." IEDM 85, pp. 208-211.
Japenese Journal of Applied Physics, 21, pp. 34-38, Symposium on VLSI Technology, Sep. 1-3, 1982.
IBM Technical Disclosure Bulletin, 26, pp. 4303-4307, Jan. 1984.

*Primary Examiner*—Martin H. Edlow
*Assistant Examiner*—Stephen D. Meier
*Attorney, Agent, or Firm*—John T. Rehberg

[57] ABSTRACT

A gate electrode having an insulating top layer as well as insulating sidewall spacers permits the source and drain regions to be electrically contacted through windows directly above the source and drain regions formed in a window pad layer. There is a conducting layer, termed a window pad layer, over portions of these regions. Because of the insulating top layer and sidewall spacers on the gate, the window may be misaligned with respect to the source and drain regions, and maybe even closer to the gate than are these regions, but electrical contacts to these regions are still obtained. The window pad layer may also be used as sublevel interconnect.

9 Claims, 2 Drawing Sheets

FOLDED EXTENDED WINDOW FIELD EFFECT TRANSISTOR

This is a division of application Ser. No. 128,834 filed Dec. 4, 1987 U.S. Pat. No. 4,844,776.

This invention relates to the field of field effect transistors and to methods for making such devices.

BACKGROUND OF THE INVENTION

As the complexity of integrated circuits continues to increase, there is a continuing need to reduce dimensions of the individual components of the integrated circuits to increase device packing density. For field effect transistors, this need includes not only reducing the dimensions of the channel but also the areas of the source and drain regions.

One approach to reducing the channel length is described in U.S. Pat. No. 4,324,038 issued on Apr. 13, 1982 to C. C. Chang et al. The device disclosed can be termed a "grooved gate" which is formed by patterning a metal or silicide, silicon oxide, silicon nitride structure to form an opening between the field oxide regions, depositing and etching an oxide layer to form insulating sidewall spacers, growing a gate oxide and making the appropriate metal contacts. In forming the sidewalls, the silicon nitride acts as an etch stop to prevent overetching of the silicon oxide. The sidewalls act as an insulator to prevent contact between the gate metal and the source and drain contact layers. The described gate structure may be adversely affected by the etching which is necessary for the gate, because the etching may damage the portion of the substrate forming the channel. Additionally, patterning requires a gate head to compensate for misregistration and the horizontal dimension required for the gate layout is not a minimum.

It has also been realized that self-aligned source and drain contacts can reduce device size. One such process is described by NEC in Japanese Journal of Applied Physics, 21, pp. 34–38, Symposium on VLSI Technology, Sept. 1–3, 1982. After gate formation and source and drain implantation, an oxide is formed which is thicker on the gate than on the bulk silicon. Etching removes the oxide on the bulk silicon while leaving oxide on the gate. A nitride layer is now formed on the bulk silicon and serves as a mask during a second oxidation. The nitride is removed and doped polysilicon deposited for the source and drain contacts. IBM Technical Disclosure Bulletin, 26, pp. 4303–4307, January, 1984 describes a generally similar process although the nitride layer is formed by ion implantation.

The NEC process suffers several drawbacks. It is difficult to control the oxide etching because there is no etch stop and reliance must be placed on the difference in oxide thicknesses. Additionally, growing the nitride at high temperature is not desirable because the junction may be driven deeper. The IBM process suffers the drawback that the ion implantation is likely to create many defects and lead to high stress levels.

Another approach to producing devices with small area source and drain regions is described in U.S. Pat. No. 4,453,306 issued on June 12, 1984 to William T. Lynch and Frederick Vratny. Device fabrication begins with formation of a multilevel gate electrode having sequential layers of a conductor, an insulator and a silicide forming metal deposited on an insulating layer. Standard depositing and patterning techniques are used. A layer of polycrystalline silicon is blanket deposited over the entire structure, and a heat treatment forms the silicide on the gate structure. A selective etch removes the silicide and leaves the polysilicon aligned with respect to both the source and drain regions. Windows are formed in a blanket deposited dielectric layer for contacts to both the source and drain regions.

Although the structure is self-aligned, the precise control of the process may be difficult as the boundary between the polysilicon and the silicide may not be sharp because diffusion and etching of the sidewalls may occur. Also, the etching of the four layer metal containing sandwich may require a separate etching machine because of possible contamination. The windows are spaced further from the gate electrode than are the source and drain regions thus reducing packing density. The spacing of the windows is stated as desirable because it, e.g., reduces the possibility of aluminum spiking into the substrate and simplifies etching as all three contacts are at approximately the same level. Deeper etching for source and drain contact window than for the gate might cause growth of the gate window.

SUMMARY OF THE INVENTION

We have found that a field effect transistor is fabricated by a method comprising forming a gate electrode structure having an insulating top layer, fabricating insulating sidewall spacers on the sides of the gate electrode, forming source and drain regions, depositing and patterning a conductive window pad layer so that at least a portion of the layer contacts at least portions of both the source and drain regions, depositing and patterning a dielectric layer to form windows substantially directly above said source and drain regions exposing at least portions of said window pad layer and depositing a metal in said windows. The spacing between the gate to source and drain regions, as well as the regions themselves may be made small, as compared to a conventional structure, in the fabricated structure which we term a "folded extended window." The openings, i.e., windows, used to contact the source and drain regions may be substantially directly above said source and drain regions with, at most, a minimum horizontal distance between the windows and the corresponding source and drain regions. In fact, the windows may be closer to the gate electrode than are the source and drain regions. The insulating layer, which is also etch resistant, on top of the gate electrode minimizes the danger that any misalignment in patterning the conductive layer results in a short between the conductive layer and the gate electrode and also facilitates fabrication of the sidewall spacers by preventing etching of the underlying gate structure. The conductive layer, which is also referred to as a window pad layer, may extend onto the field oxide as well as the sidewall spacers, and as a result, dimensional tolerances for the formation of the windows are greatly increased. In a preferred embodiment, TiN is used for the conductive layer which may additionally be used as an interconnection runner between source and drain regions of different transistors. In another preferred embodiment, a silicide or polycide is used for the conductive layer.

BRIEF DESCRIPTION OF THE DRAWING

FIG. 1 shows the structure before gate patterning;

FIG. 2 shows the structure after the gate has been patterned and the sidewall spacers have been fabricated;

FIG. 3 shows the structure after the window pad layer has been deposited and patterned;

FIG. 4 shows the structure after the metal for source and drain contacts has been deposited and patterned;

For reasons of clarity, the elements of the structures depicted are not drawn to scale.

DETAILED DESCRIPTION

An exemplary method of fabricating a field effect transistor will be described together with several variations. Other variations will be apparent to those skilled in the art.

Figure 1:
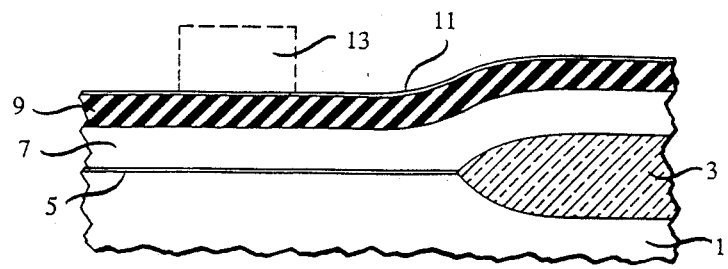
FIGS. 1–4 illustrate stages in the fabrication of field effect transistors according to this invention, and in particular.

Depicted in FIG. 1 are silicon substrate 1 and disposed thereon: field oxide regions 3, gate oxide 5, silicide/polysilicon layer 7, deposited oxide 9, silicon nitride ($Si_3N_4$) layer 11 and patterned photoresist 13. The photoresist has been patterned for fabrication of the gate electrode, i.e., transfer of the gate electrode pattern into layers 5, 7, 9, and 11. The structure depicted is fabricated by techniques well known to those skilled in the art and accordingly need not be described in detail. Appropriate layer thicknesses will be readily selected by those skilled in the art. Although a sectional view of only a single device is depicted in FIGS. 1–4, it will be readily appreciated that many devices are present in an integrated circuit.

The metal layer used to form the silicide may be omitted if only a polysilicon layer is desired, i.e., the silicide need not be present. Layer 11 is resistant to the etch, described later, used to form the insulating sidewall spacers. materials other than silicon nitride may be used for layer 11 provided that they etch at a rate significantly lower than the rate for the sidewall spacer material.

Figure 2:
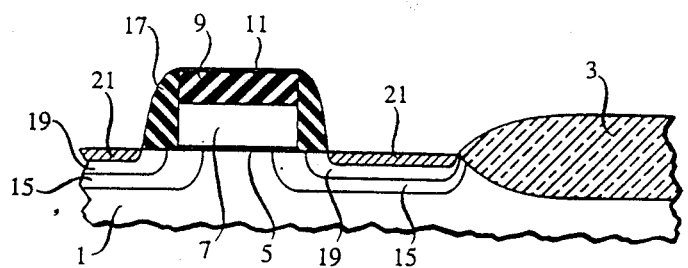
Figure 3:
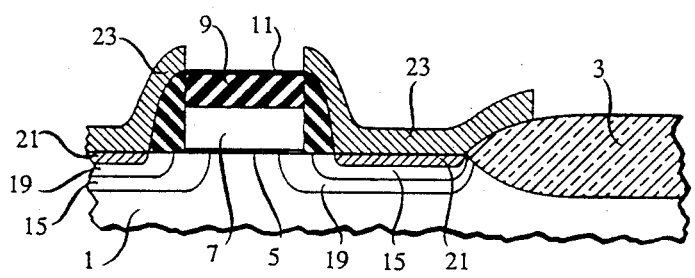

Conventional etching techniques are now used to define the gate structure, that is, to pattern the layers that form the gate structure. An ion implantation is performed to form lightly doped source and drain regions 15. The insulating sidewall spacers 17 are formed by techniques well known to those skilled in the art. For example, an oxide can be blanket deposited and then etched back to leave the sidewall spacers. The $Si_3N_4$ acts as an etch stop and prevents etching of the gate during this step. A second ion implantation is now performed for the source and drain regions 19 followed by, if desired, silicide 21 formation in the source and drain regions. The resulting structure is depicted in FIG. 2.

A layer of conductive material, for example, TiN, is now deposited and patterned so that the source and drain regions, as well as the sidewall spacers, are covered. The patterned layer is called window pad 23. A portion of the field oxide will be typically covered. Techniques for depositing and patterning TiN are well known in the art and need not be described in detail. The layer may be as much as 600 mm thick although typically only 200 nm will be needed. Slight misregistrations of the mask may be tolerated as the materials surrounding the source and drain regions are electrically insulating and electrical shorts will not occur if the window pad covers a small portion of the gate electrode surface. It is necessary that only the portions of the source and drain regions required to form electrical contacts be covered, i.e., not all of the source and drain regions need be covered.

Figure 4:
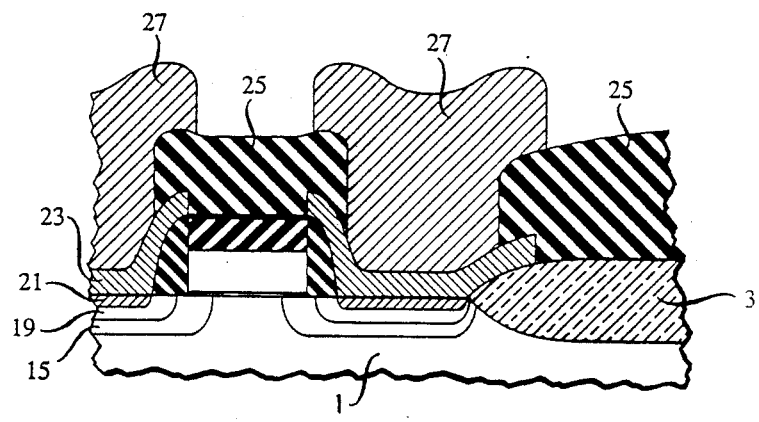

A passivating dielectric layer 25 is now deposited and patterned to expose selected portions of the window pads for electrical contacts as well as open windows for the gate contacts. The windows lie substantially directly above the source and drain regions but need not be the same size as the source and drain regions. Misregistrations will result in the windows exposing portions of adjacent insulating layers. A metal, for example, aluminum or tungsten, is now blanket deposited to cover the dielectric and fill the windows. The metal is now patterned to form contacts 27 and the resulting structure is depicted in FIG. 4. Alternatively, selective deposition may be used to fill the windows.

The spacings between the window and the gate, as well as the source and drain regions, may be greatly reduced as compared to typical prior art structures. This is true because the window can overlap the sidewall spacer and the field oxide provided that the window exposes a portion of the window pad layer as shown in FIG. 4. It is also noted that TiN is advantageously used as a window pad layer material because it also serves as a barrier preventing spiking of either aluminum or tungsten from the window into the substrate. It is also a desirable material because the etching selectivity of TiN with respect to the dielectric during the window etch is extremely good and may be, typically 1:15. It will be readily appreciated that any conductive material with similar etching properties may be used for the window pad.

Figure 5:
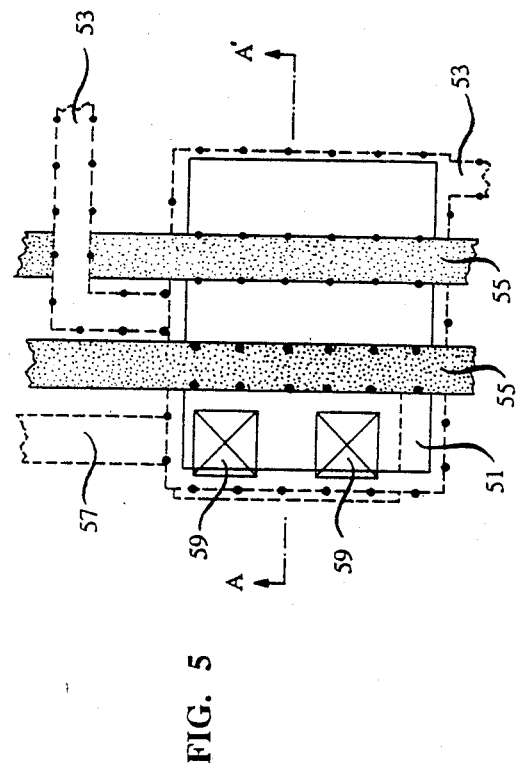
FIG. 5 shows a cell using the window pad layer as a sublevel interconnection.
Figure 6:
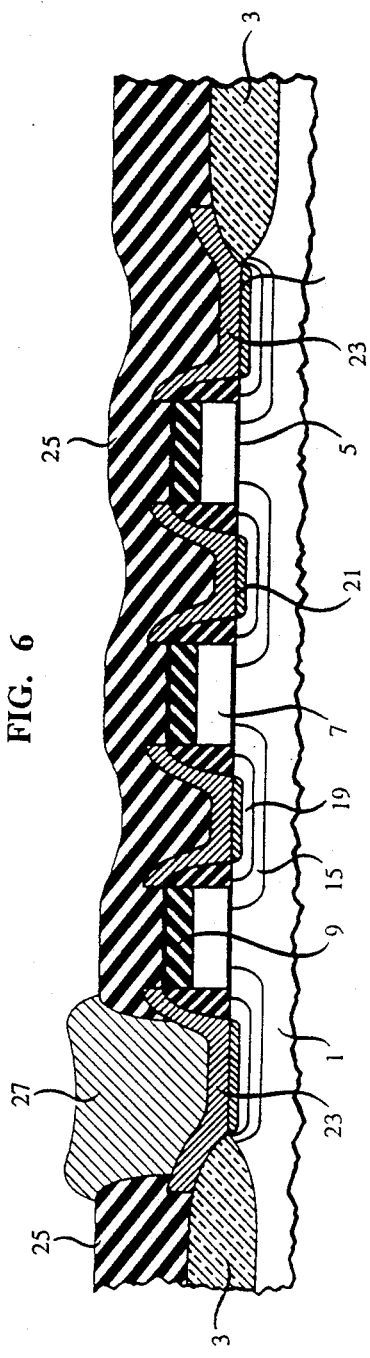
FIG. 6 is a sectional view of the cell in FIG. 5 along the line A—A'.

The window pad layer is formed from a conductive material and, in another embodiment of this invention, is used for sublevel interconnection runners. This use can further reduce the chip layout area. An exemplary layout is depicted in FIG. 5 in a top view of a cell showing TiN used as sublevel interconnection. Depicted are the thin oxide layer 51, sublevel interconnects 53, polysilicon gate runners 55, and contact windows 59. A sectional view of the structure along the line A—A' is shown in FIG. 6. The numerals used correspond to those used in FIGS. 1–4. For this embodiment, the window pad layer is patterned not only for the source and drain contacts but also to interconnect the source and drain regions of different transistors. If desired, a merged contact scheme may also connect to the gate runner. It will be appreciated that the window pad layer is insulated from the gate electrodes and can therefore cross the gate structures. It will also be readily appreciated that the sublevel interconnection described needs only one deposition and one patterning step.

In addition to the significant amount of area saved by the transistor structure, the sublevel interconnection scheme can save additional area due to the routing structure depicted. For example, the output of a logic cell is usually obtained by connecting the source/drain regions to a polysilicon runner by an aluminum metallization. This means that the source and drain regions need to contact the aluminum runner and that the aluminum runner needs to contact the polysilicon by an additional window opening contact. The polysilicon is used as an output runner across the field oxide and connects to the input of another cell. However, the structure depicted can greatly improve the routing. The window pad layer can be patterned to run directly across the field oxide to any desired input node without the need for any indirect connection. Therefore, some output polysilicon runners can be eliminated and their corresponding areas saved. Additionally, window contact area can be saved and the number of window contacts can also be reduced.

Thus, the interconnection scheme described can cross the field oxide to obtain additional flexibility. Additionally, it can cross polysilicon runners and can connect to a polysilicon runner by a merged contact or a butting contact.

The fabrication sequence when the window pad layer is formed from a polycide differs slightly from the sequence described for TiN. In particular, the window pad material, polysilicon, used for sublevel interconnects, is deposited after the sidewall spacers are formed. The source and drain implants are performed followed by window pad layer patterning. The source and drain regions are doped by a thermal drive out from the polysilicon as the implant energies are desirably chosen so that the implant damage is restricted to the polysilicon. A metal film is now deposited and the salicide (self-aligned silicide) formed by well known techniques. The unreacted metal may be removed by a wet chemical etch. Exemplary etching solutions are mixtures of $H_2SO_4/H_2O_2$ and $H_3PO_4/H_2O_2/H_2O$. The etching selectivities of polysilicon to oxide and oxide to polycide are 20-30:1 and 10-15:1, respectively. Both ratios are quite acceptable for window pad patterning and opening windows and ratios as low as 7:1 are likely to be useful.

Those skilled in the art will readily appreciate that other embodiments of this invention are possible.

I claim:

1. An integrated circuit comprising:
   a gate electrode structure, including a gate oxide and an insulating top layer;
   insulating sidewall spacers on the sides of said gate electrode;
   source and drain regions, said source and said drain regions being on opposite sides of said gate electrode;
   a conductive window pad layer, at least portions of said window pad layer contacting at least portions of said source or drain regions and covering at least portions of said sidewall spacers;
   a patterned dielectric layer having windows exposing portions of said layer, said windows being substantially above said source and drain regions; and
   electrical contacts to said source, gate and drain, said electrical contacts to said source region and drain being through said windows.

2. A device as recited in claim 1 in which said sidewall spacer comprises an oxide.

3. A device as recited in claim 2 in which said window pad layer material is selected from the group consisting of TiN, silicides, polysilicon and polycides.

4. A device as recited in claim 3 in which said window pad layer comprises polysilicon.

5. A device as recited in claim 3 in which said window pad layer comprises TiN.

6. A device as recited in claim 5 in which said window pad layer contacts source/drain regions of at least two transistors.

7. A device as recited in claim 6 further comprising a field oxide separating two transistors, said window pad layer crossing the gate electrode structure of at least one transistor or the field oxide separating two transistors.

8. An integrated circuit having a plurality of transistors comprising:
   a gate electrode structure, including a gate dielectric and an insulating top layer;
   insulating sidewall spacers on the sides of said gate electrode;
   a source/drain region, said region being on a side of said gate electrode;
   a conductive window pad layer, at lease portions of said window pad layer covering at least portions of said sidewall spacer and contacting at least portions of said source/drain region;
   a dielectric layer having at least one window exposing a portion of said window pad layer, said window being substantially above said source/drain region; and
   an electrical contact in said window.

9. The device as recited in claim 8 in which the total number of said windows is less than the total number of the source/drain regions.

* * * * *